United States Patent
Rofougaran (10) Patent No.: US 7,830,981 B2
(45) Date of Patent: *Nov. 9, 2010

(54) METHOD AND SYSTEM FOR MINIMIZING POWER CONSUMPTION IN A COMMUNICATION SYSTEM

(75) Inventor: Ahmadreza Rofougaran, Newport Coast, CA (US)

(73) Assignee: Broadcom Corp.

(*) Notice: Subject to any disclaimer, the term of this patent is extended or adjusted under 35 U.S.C. 154(b) by 704 days.

This patent is subject to a terminal disclaimer.

(21) Appl. No.: 11/536,655

(22) Filed: Sep. 29, 2006

(65) Prior Publication Data

US 2008/0080640 A1    Apr. 3, 2008

(51) Int. Cl.
*H04L 25/49* (2006.01)
(52) U.S. Cl. ....................................... 375/297
(58) Field of Classification Search ......... 375/295, 375/296, 297; 455/114.2, 114.3, 127.1, 126; 330/127, 149, 297
See application file for complete search history.

(56) References Cited

U.S. PATENT DOCUMENTS 5,420,536 A * 5/1995 Faulkner et al. ............. 330/149

7,447,485 B2 * 11/2008 Ishikawa et al. ......... 455/127.1

* cited by examiner

*Primary Examiner*—Sam K Ahn
(74) *Attorney, Agent, or Firm*—McAndrews, Held & Malloy, Ltd.

(57) ABSTRACT

A method and system for minimizing power consumption in a communication system is provided. The method may include adjusting the supply voltage of a linear amplifier, which may be used for amplifying a RF signal, in proportion to the envelope of the baseband of the RF signal. The signals may correspond to a variety of communication protocols. For example, WCDMA, HSDPA, HSUDPA, GSM, GPRS, EDGE, WiMAX, OFDM, UWB, ZigBee, and BlueTooth. The baseband signal may be delayed by a number of samples before being input into the amplifier. The envelope may be measured by evaluating a plurality of I and Q samples from the baseband signal. The number of samples may be calculated by measuring the intermodulation distortion at the output of the amplifier. The supply voltage may be generated by a switching regulator. The method may also include adjusting a bias voltage of the amplifier in proportion to the envelope of the baseband signal, where the bias voltage may control the gain of the amplifier. The bias voltage may also be generated by a switching regulator.

27 Claims, 6 Drawing Sheets

Fig. 5

METHOD AND SYSTEM FOR MINIMIZING POWER CONSUMPTION IN A COMMUNICATION SYSTEM

CROSS-REFERENCE TO RELATED APPLICATIONS/INCORPORATION BY REFERENCE

This application makes reference to:

U.S. application Ser. No. 11/536,678, filed on even date herewith;

U.S. application Ser. No. 11/536,682, filed on even date herewith;

U.S. application Ser. No. 11/536,650, filed on even date herewith;

U.S. application Ser. No. 11/536,644, filed on even date herewith;

U.S. application Ser. No. 11/536,676, filed on even date herewith;

U.S. application Ser. No. 11/536,659, filed on even date herewith;

U.S. application Ser. No. 11/536,673, filed on even date herewith;

U.S. application Ser. No. 11/536,679, filed on even date herewith;

U.S. application Ser. No. 11/536,670, filed on even date herewith;

U.S. application Ser. No. 11/536,672, filed on even date herewith;

U.S. application Ser. No. 11/536,648, filed on even date herewith;

U.S. application Ser. No. 11/536,669, filed on even date herewith;

U.S. application Ser. No. 11/536,666, filed on even date herewith;

U.S. application Ser. No. 11/536,675, filed on even date herewith;

U.S. application Ser. No. 11/536,685, filed on even date herewith;

U.S. application Ser. No. 11/536,645, filed on even date herewith;

U.S. application Ser. No. 11/536,660, filed on even date herewith;

U.S. application Ser. No. 11/536,657, filed on even date herewith;

U.S. application Ser. No. 11/536,662, filed on even date herewith;

U.S. application Ser. No. 11/536,688, filed on even date herewith;

U.S. application Ser. No. 11/536,667, filed on even date herewith;

U.S. application Ser. No. 11/536,651, filed on even date herewith;

U.S. application Ser. No. 11/536,656, filed on even date herewith; and

U.S. application Ser. No. 11/536,663, filed on even date herewith.

The above stated applications are hereby incorporated herein by reference in their entirety.

FIELD OF THE INVENTION

Certain embodiments of the invention relate to communication systems. More specifically, certain embodiments of the invention relate to a method and system for minimizing power consumption in a communication system.

BACKGROUND OF THE INVENTION

Mobile communications has changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the data connections, such as the mobile Internet, for example, is the next step in the mobile communication revolution. The mobile Internet is poised to become a common source of everyday information, and easy, versatile mobile access to this data will be taken for granted.

Third generation (3G) cellular networks have been specifically designed to fulfill these future demands of the mobile Internet. As these services grow in popularity and usage, factors such as cost efficient optimization of network capacity and quality of service (QoS) will become even more essential to cellular operators than it is today. These factors may be achieved with careful network planning and operation, improvements in transmission methods, and advances in receiver techniques. To this end, carriers need technologies that will allow them to increase downlink throughput and, in turn, offer advanced QoS capabilities and speeds that rival those delivered by cable modem and/or DSL service providers. In this regard, networks based on wideband CDMA (WCDMA) technology may make the delivery of data to end users a more feasible option for today's wireless carriers.

The evolution of WCDMA technology has resulted in the development of various wireless communication technologies, including General Packet Radio Service (GPRS), Enhanced Data rates for GSM (Global System for Mobile communications) Evolution (EDGE), Universal Mobile Telecommunications System (UMTS), and High Speed Downlink Packet Access (HSDPA), for example. In this regard, the GPRS and EDGE technologies may be utilized for enhancing the data throughput of present second generation (2G) systems such as GSM. The UMTS wireless communication technology is an adaptation of the WCDMA 3G system by GSM. The HSDPA wireless communication technology is an Internet protocol (IP) based service, oriented for data communications, which adapts WCDMA to support data transfer rates on the order of 10 megabits per second (Mbits/s).

Battery life in mobile devices, such as cellular telephones, has always been an important consideration for consumers. For some consumers, battery life issues may be mitigated by using higher capacity batteries. But with higher capacity usually comes increased weight and size, which are important consideration for other consumers. One way in which designers have tackled this dilemma has been to optimize battery usage. For example, many cellular protocols facilitate a discontinuous RX and TX so that the receiver and transmitter portions of the cellular telephone are disabled when not in use. In addition, the processors in such devices may shut down other modules and may even disable various system clocks when they are not needed. For instance, USB controllers, SIM controllers and the like may be disabled when they are not needed and the CPU clock may be shutdown as well.

Although these techniques have increased battery life, the need for smaller and smaller mobile devices and therefore smaller and smaller batteries has persisted. Therefore, additional techniques are required to extend battery life even further.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for minimizing power consumption in a communication system, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for minimizing power consumption in a communication system. Exemplary aspects of the invention may comprise adjusting the supply voltage of a linear amplifier, which may be used for amplifying a RF signal, in proportion to the envelope of the baseband of the RF signal. The signals may correspond to a variety of communication protocols. For example, WCDMA, HSDPA, HSUDPA, GSM, GPRS, EDGE, WiMAX, OFDM, UWB, ZigBee, and BlueTooth. The baseband signal may be delayed by a number of samples before being input into the amplifier. The envelope may be measured by evaluating a plurality of I and Q samples from the baseband signal. The number of samples may be calculated by measuring the intermodulation distortion at the output of the amplifier. The supply voltage may be generated by a switching regulator. The method may also include adjusting a bias voltage of the amplifier in proportion to the envelope of the baseband signal, where the bias voltage may control the gain of the amplifier. The bias voltage may also be generated by a switching regulator.

Figure 1:
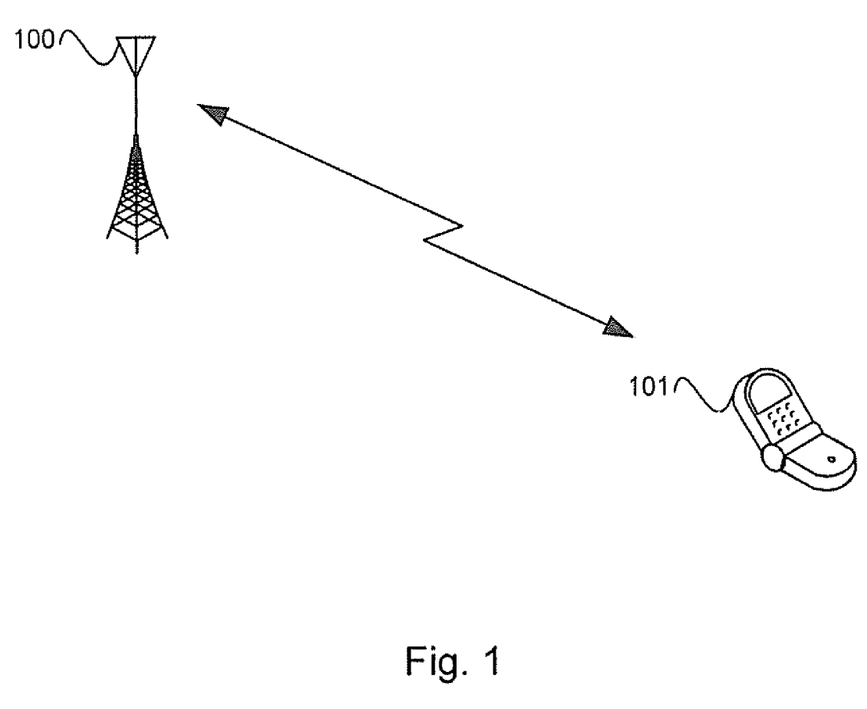
FIG. 1 is a block diagram of an exemplary mobile device communicating in a wireless system, in connection with an embodiment of the invention.

FIG. 1 is a block diagram of an exemplary mobile device communicating in a wireless system, in connection with an embodiment of the invention. Referring to FIG. 1, there is shown a mobile device 101, and a cellular communication tower 100. The mobile device 101 may comprise suitable logic, circuitry, and/or code that may enable transmission of information to the cellular communication tower 100. In this regard, the mobile device 101 may transmit information conforming to one of several wireless communication standards. For example, the mobile device 101 may transmit information conforming to a GSM standard. In the case of GSM, a time division multiplexed (TDM) scheme may be utilized. Data transmitted using the GSM standard may produce a constant envelope. That is, the peak-to-peak variation of an output signal may not vary with respect to the type of information being communicated. The mobile device 101 may also be capable of communicating information using a wideband code division multiple access (WCDMA) communication standard, such as UMTS or IS-95. In the case of WCDMA, the envelope of the output signal may vary with respect to the type of data being transmitted. The mobile device 101 may be capable of communicating information using other standards as well. For example, HSDPA, HSUDPA, GPRS, EDGE, WiMAX, OFDM, UWB, ZigBee, and BlueTooth.

Figure 2A:
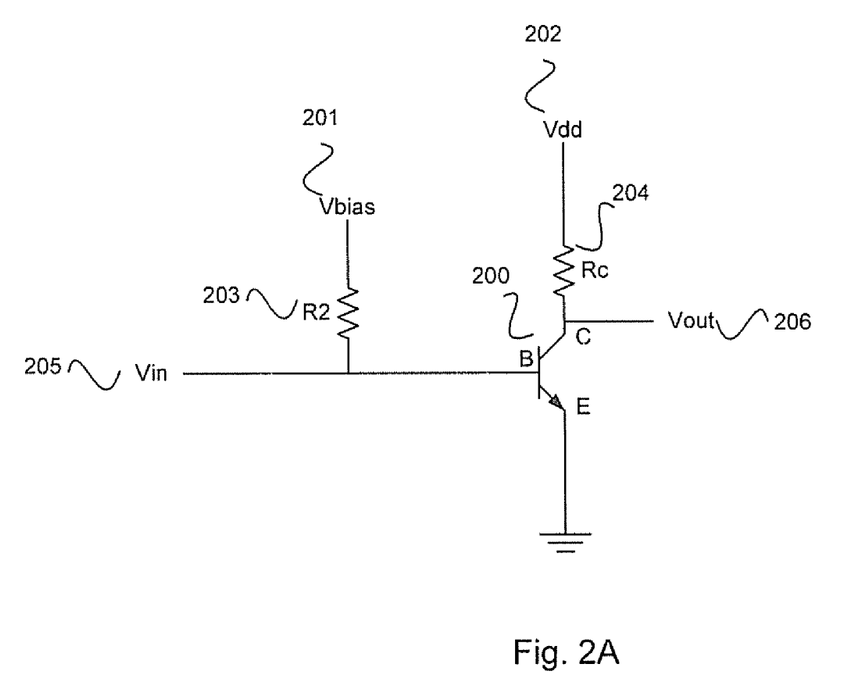
FIG. 2A is a block diagram of an exemplary linear amplifier, which may be utilized in connection with an embodiment of the invention.

FIG. 2A is a block diagram of an exemplary linear amplifier, which may be utilized in connection with an embodiment of the invention. Referring to FIG. 2A, there is shown a transistor 200, a collector resistor (Rc) 204, a bias resistor 203, a bias input voltage 201, a collector voltage 202, an input signal 205, and an output signal 206.

In operation, the collector of the transistor 200 may be connected to a supply voltage 202, via a collector resistor (Rc). A bias voltage 201 may also be provided for controlling the voltage on the collector of the transistor 200. The bias voltage may then be modulated by an input signal 205 and 209. The output signal 208 may be an amplified version of the input signal.

The bias voltage 201 may be chosen so as to maximize the amount of voltage swing available for the output signal 208. For example, the bias voltage 201 may be chosen so that the collector voltage on the transistor 200 is, for example, 50% of the supply voltage 202. This may enable the greatest peak-to-peak voltage swing in the output signal 208. The bias voltage may also control the gain of the transistor.

Figure 2B:
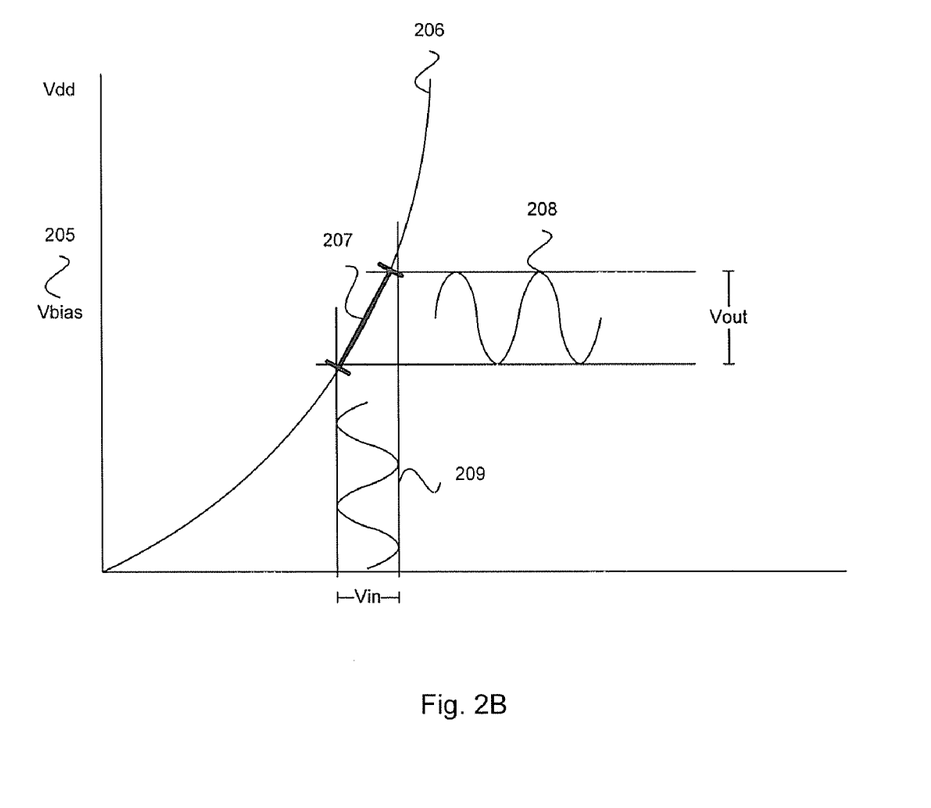
FIG. 2B is a diagram of an exemplary input/output relationship of a linear amplifier, which may be utilized in connection with an embodiment of the invention.

FIG. 2B is a diagram of exemplary input/output characteristics of a linear amplifier, which may be utilized in connection with an embodiment of the invention. Referring to FIG. 2B, there is shown a transconductance curve 206, an active region 207, an input signal 209, and an output signal 208. The characteristics shown in FIG. 2B may correspond to the circuit shown in FIG. 2A Referring, to FIG. 2B, a lower bias voltage may result in a lower gain and conversely a higher bias voltage may result in a higher gain. In this regard, the gain of the transistor 200 may be non-linear when the variation of the output signal 208 is large.

Most of the power dissipated in the circuit shown in FIG. 2A may be dissipated by the collector resistor 204 and the transistor 200. The power dissipated in the two components may be represented by following formulas:

$$P_{Rc} = \frac{(V_{dd} - V_c)^2}{R_C}$$

$$I_{Rc} = \frac{(V_{dd} - V_c)}{R_C}$$

$$P_Q = V_c \cdot I_{Rc}$$

$$P_{TOT} = P_{Rc} \cdot P_Q$$

where Vc is the collector voltage set by the bias voltage 201, $I_{RC}$ is the current passing through the collector resistor, $P_{RC}$ is the power dissipation in the collector resistor, $P_Q$ is the power dissipation in the transistor, and $P_{tot}$ is approximate power dissipation of the circuit. Thus, the total power dissipation in the circuit may be lowered by lowering the supply voltage. It may therefore be advantageous to limit the supply voltage to that amount needed to support a given output voltage swing in the output signal 208. In situations where a lower gain may be needed, the bias voltage may be chosen so as to move the output signal 208 down on the curve shown in FIG. 2B. This may allow for a further reduction in the supply voltage and therefore may further lower the overall power dissipation in the circuit.

Figure 3:
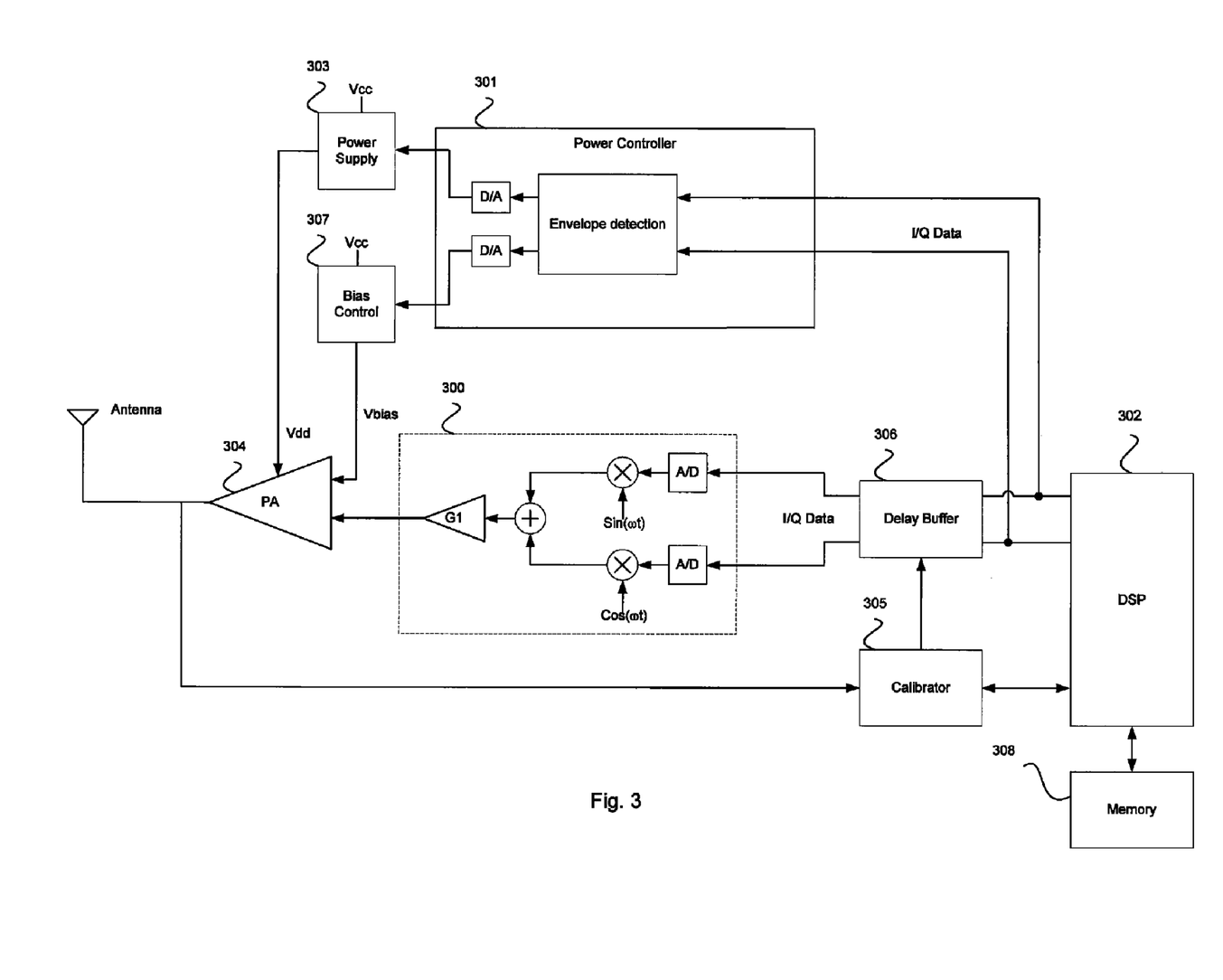
FIG. 3 is a block diagram of an exemplary system for dynamically adjusting the power dissipation in a communication system, in accordance with an embodiment of the invention.

FIG. 3 is a block diagram of an exemplary system for dynamically adjusting the power dissipation in a communication system, in accordance with an embodiment of the invention. Referring to FIG. 3, there is shown a power amplifier (PA) 304, a mixer 300, a delay buffer 306, a DSP 302, a non-volatile memory 308, a calibrator 305, a power controller 301, a power supply 303, and a bias controller 307. The PA 304 may comprise suitable logic, circuitry and or code that may enable amplifying an input signal so that it may be transmitted via an antenna. The internal structure of the PA may comprise the circuitry shown in FIG. 2A. In this regard, in addition to an input and output signal, the PA may also have supply voltage input and a bias voltage input.

The mixer 300 may comprise suitable logic, code, and/or circuitry that may enable RF modulation of a baseband signal. In this regard, the input signal may be an in-phase and quadrature phase (I/Q) representation of data to be transmitted. The I/Q data may originate from a DSP 302 and pass through a delay buffer 306 before being input into the mixer 300. The mixer 300 may then output an RF signal to the PA 304, where it may be amplified and transmitted via an antenna.

The delay buffer 306 may comprise suitable logic, circuitry, and/or code that may enable delaying an input signal by a specified number of samples. In this regard, the delay buffer 306 may comprise a FIFO. For example, the FIFO may be sized to hold 10 I/Q samples. Thus, the samples leaving the delay buffer may be delayed by 10 samples. The I/Q samples may be communicated to the delay buffer by the DSP 302 and then passed on to the mixer 300.

The DSP 302 may comprise suitable logic, circuitry, and/or code that may enable processing signals in a communication system. In this regard, the DSP 302 may be adapted to process GSM and/or WCDMA signals. It may also be adapted to process signals corresponding to other protocols, such as HSDPA, HSUDPA, GPRS, EDGE, WiMAX, OFDM, UWB, ZigBee, and BlueTooth. The non-volatile memory 308 may comprise suitable logic, circuitry, and/or code that may enable storing data. In this regard, the non-volatile memory 308 may be capable of retaining data after a system reset.

The power controller 301 may comprise suitable logic, circuitry, and/or code that may enable generation of a power supply and bias control reference voltage in proportion to the envelope of a signal. In this regard, the power controller 301 may input I/Q signals communicated from the DSP 302. An envelope detector may then analyze the incoming I/Q signals to determine an average amplitude of the signal. The amplitude of the signal may correspond to the following formula:

$$S = \sqrt{I^2 + Q^2}$$

where S is the amplitude of the signal and I and Q are the respective in-phase and quadrature components of the signal. The power controller 301 may collect a series of samples that may be used to determine an average signal amplitude or envelope of the signal. In this regard, the power controller 301 may comprise a memory for storing the samples. The power controller 301 may then output a power supply reference voltage and a bias controller reference voltage. These reference voltages may be proportional to the average envelope computed. For example, if the envelope detector detects a signal with a large envelope, the reference voltages may be increased. Conversely, if a small envelope is detected the reference voltages may be decreased. The reference voltages may be output to the power supply 303 and bias controller 307.

The power supply 303 and bias controller 307 may comprise suitable logic, circuitry, and/or code that may enable generation of an output voltage. In this regard, the input voltage to the power supply 303 and bias controller 307 may be larger or smaller than the respective outputs. The power supply 303 and bias controller 307 may accomplish the conversion by utilizing a switch mode regulator. The regulator may regulate the output voltage by converting the input voltage into a pulse and then varying the duty cycle of that pulse in response to a reference input. For example, given an input voltage of 10 volts, an output voltage of 5 volts may be obtained by generating a pulse with a 50% duty cycle. The pulse may then be filtered to obtain a DC voltage.

The voltage output from the power supply 303 and bias controller 307 may be controlled by the power controller 301. In this manner, the power supply 303 and bias controller 307 may convert a higher voltage to a lower voltage while minimizing the power dissipation associated with such a conversion. The output of the power supply 303 may be utilized to power the PA 304. The output of the bias controller 307 may be utilized to adjust the DC bias of the PA 304 and thus control the gain of the PA 304.

The calibrator 305 may comprise suitable logic, circuitry, and/or code that may enable minimizing the amount of intermodulation distortion (IMD) produced at the output of a PA. In this regard, it may be necessary to match the delay path of the power controller 301 to that of the mixer 300 to ensure that the PA 304 may have enough headroom to handle a signal of a given envelope. For example, the PA 304 may not need as much headroom to handle signals with small envelopes. Thus, the supply voltage for the PA 304 may be reduced. However, if the supply voltage for the PA 304, for example, is not increased before a signal with a higher envelope enters the PA 304, the PA 304 may saturate. Therefore, the amount of delay in the mixer 300 and the power controller 301 must be matched so that the PA 304 may have enough headroom for a pending signal before the signal arrives at the PA 304.

The calibrator 305 may match the delay of the power controller 301 and mixer 300 by measuring the amount of IMD at the output of the PA 304. This may be accomplished by generating sinusoidal test signals in the DSP 302, converting those signals into the I/Q domain and then passing the signals through the circuitry shown in FIG. 3. For example, the DSP 302 may output a first test signal with a small envelope and then output a second signal with a larger envelope. When the delay, for example, is not matched, IMD may be produced at the output of the PA 304. The calibrator 305 may use this information to adjust the amount of delay produced by the delay buffer 306 so as to reduce or eliminate IMD at the output of the PA 304.

It may only be necessary to calibrate the system once. Therefore, after calibration the proper amount of delay may be stored in a non-volatile memory 308 and re-read whenever the system may be re-enabled.

In operation an I/Q signal may be communicated to both the delay buffer 306 and the power controller 301. The power controller 301 may store a series of I/Q samples so as to determine an average envelope. The power controller 301 may then determine that little or no gain in the PA 304 may be necessary. In this case, the bias voltage produced by the bias controller 307 may be reduced. This may allow for a reduced power supply voltage in the PA 304 as well. For example, referring to FIG. 2B, for lower gains, the active portion 207 may be moved to a lower point on the transconductance curve 206 by decreasing the bias voltage. As a result, the supply voltage for the PA 304 may be reduced as well. If higher gain is required, the active portion may be moved to a higher point on the transconductance curve 206 by increasing the bias voltage. To prevent saturation, the power supply voltage for the PA 304 may have to be increased. In this manner the power dissipation in the PA 304 may be minimized by supplying the minimum supply voltage necessary to avoid PA 304 saturation.

In order to prevent IMD at the output of the PA 304, the I/Q signals entering the mixer 300 may have to be delayed by a predetermined number of samples via the delay buffer 306. This may be necessary so that the power controller 301 may adjust the supply and bias voltages of the PA 304 before the modulated I/Q signals arrive at the input of the PA 304. For example, if the delay is not set properly, the power supply voltage may be too low, in which case the PA may saturate. If the power supply voltage is too high, optimal power efficiency may not be achieved. Therefore, delaying the I/Q data entering the mixer 300 by the right number of samples may prevent the PA 304 from saturating and at the same time may minimize the amount of power dissipated by the PA 304.

The optimal delay for the delay buffer 306 may be determined by the calibrator 305. The calibrator 305 may accomplish this by measuring the IMD produced by the test signals and adjusting the amount of delay produced by the delay buffer 306 so as to minimize the amount of IMD.

Figure 4:
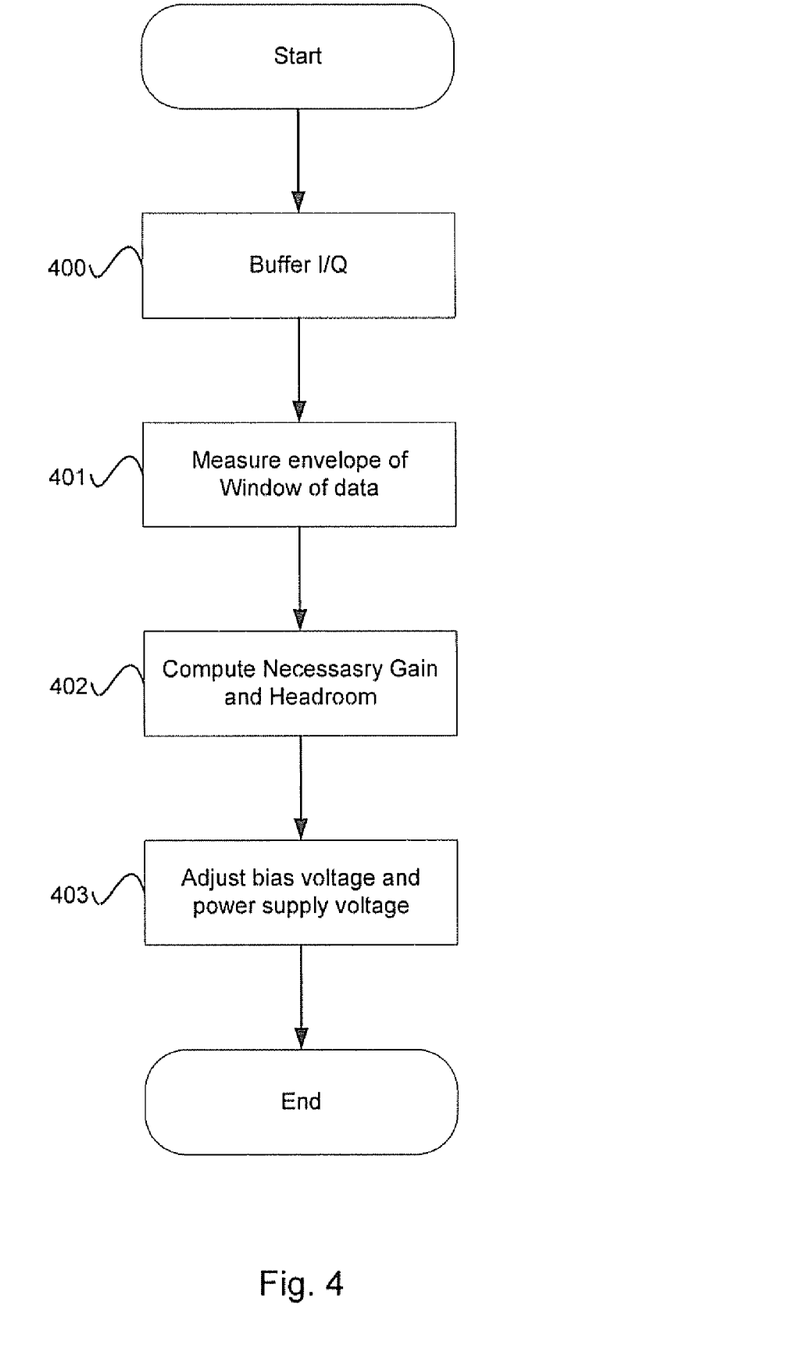
FIG. 4 is a block diagram of an exemplary flow diagram for adjusting a power supply and a bias voltage, in accordance with an embodiment of the invention.

FIG. 4 is a block diagram of an exemplary flow diagram for adjusting a power supply and bias voltage, in accordance with an embodiment of the invention. At step 400 the power controller 301 may buffer a series of I/Q samples from the DSP 302. This may allow the envelope detector within the power controller 301 to determine the envelope of the signal at step 401. At step 402, the power controller 301 may compute the gain and power supply requirements needed by the PA 304. For example, for smaller envelopes, less gain and a lower supply voltage may be required. For larger envelopes, more gain and a higher supply voltage may be required. At step 403, the power controller 301 may generate the appropriate reference voltages for the power supply 303 and bias controller 307. The power supply 303 and bias controller 307 may then provide the supply and bias voltages necessary for proper amplification of the signal from the mixer.

Figure 5:
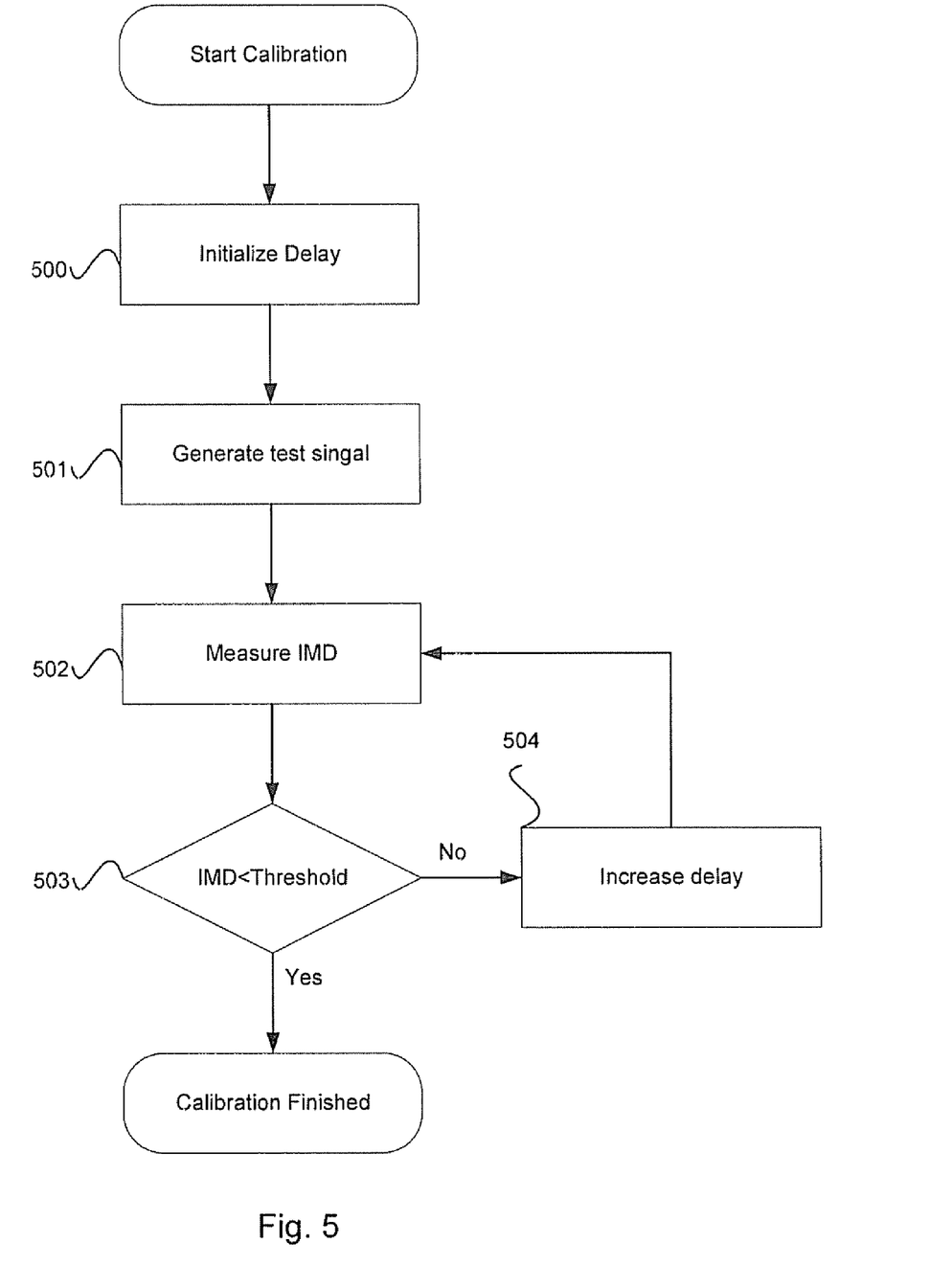
FIG. 5 is a block diagram of an exemplary flow diagram for calibrating a delay buffer, in accordance with an embodiment of the invention.

FIG. 5 is a block diagram of an exemplary flow diagram for calibrating a delay buffer, in accordance with an embodiment of the invention. In step 500, the amount of delay in the delay buffer 306 may be set to a value well below an estimated optimal value. At step 501, a sequence of sinusoidal test signals may be generated by the DSP. For example, the DSP may output a first test signal with a small envelope and then output a second signal with a larger envelope. When the delay, for example, is not matched, IMD may be produced at the output of the PA 304. The IMD may be measured by the calibrator at step 502.

At step 503, the amount of IMD may be compared to a threshold. The threshold may correspond to a level of IMD that may be acceptable. If the amount IMD is greater than the threshold, the amount of delay in the delay buffer 306 may be increased at step 504. After this step, the IMD may be measured again and compared with the threshold. Once the amount of IMD is below the threshold, the process may stop and the optimal delay found may be stored to a non-volatile memory 308 for later retrieval.

Another embodiment of the invention may provide a method for performing the steps as described herein for minimizing power consumption in a communication system. For example, the power supply 303 for the PA 304 may be adjusted in proportion to the envelope of the signal input into the PA 304, where the signal may correspond to an RF protocol, such as WCDMA, HSDPA, HSUDPA, GSM, GPRS, EDGE, WiMAX, OFDM, UWB, ZigBee, or BlueTooth, and may be delayed by a determined number of samples in the delay buffer 306 before being communicated to the PA 304. The bias voltage 307, used to control the gain of the PA 304 may also be adjusted in proportion to the envelope of the signal. The amount of delay inserted by the delay buffer 306 may be calculated by minimizing the amount of intermodulation distortion at the output of the PA 304. The envelope may be measured by evaluating a plurality of I and Q samples of the signal. The power supply 303 for the PA 304 and the bias controller 307 may be switching regulators.

Another embodiment of the invention may provide a machine-readable storage, having stored thereon, a computer program having at least one code section executable by a machine, thereby causing the machine to perform the steps as described herein for minimizing power consumption in a communication system. For example, the power supply 303 for the PA 304 may be adjusted in proportion to the envelope of the signal input into the PA 304 by code such as software and/or firmware, where the signal may correspond to a RF protocol, such as WCDMA, HSDPA, HSUDPA, GSM, GPRS, EDGE, WiMAX, OFDM, UWB, ZigBee, or BlueTooth, and may be delayed by a determined number of samples in the delay buffer 306 before being communicated to the PA 304. The bias voltage 307, used to control the gain of the PA 304 may also be adjusted in proportion to the envelope of the signal by code such as software and/or firmware. The amount of delay inserted by the delay buffer 306 may be calculated by minimizing the amount of intermodulation distortion at the output of the PA 304 and this calculation may be done by code such as software and/or firmware.

Another embodiment may provide a system with one or more circuits that may enable the system to perform the steps as described herein for minimizing power consumption in a communication system. For example, the power supply 303 for the PA 304 may be adjusted in proportion to the envelope of the signal input into the PA 304 by circuitry such as a processor and memory, where the signal may correspond to a RF protocol, such as WCDMA, HSDPA, HSUDPA, GSM, GPRS, EDGE, WiMAX, OFDM, UWB, ZigBee, or BlueTooth, and may be delayed by a determined number of samples in the delay buffer 306 before being communicated to the PA 304. The bias voltage 307, used to control the gain of the PA 304 may also be adjusted in proportion to the envelope of the signal by circuitry such as a processor and memory. The amount of delay inserted by the delay buffer 306 may be calculated by minimizing the amount of intermodulation distortion at the output of the PA 304 and this calculation may be done by circuitry such as a processor and memory.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals in a communication system, the method comprising:
    adjusting a supply voltage and a bias voltage of an amplifier in proportion to an envelope of a baseband signal so that said amplifier amplifies a delayed version of said baseband signal,
    wherein said delayed version of said baseband signal is delayed by a number of samples of said baseband signal, and wherein said delayed version of said baseband signal is based on an amount of intermodulation distortion at an output of said amplifier.

2. The method according to claim 1 comprising, adjusting a bias voltage of said amplifier in proportion to said envelope.

3. The method according to claim 1 comprising, calculating said number of samples by minimizing said amount of said intermodulation distortion at said output of said amplifier.

4. The method according to claim 1 comprising, measuring said envelope by evaluating a plurality of I and Q samples of said baseband signal.

5. The method according to claim 1 comprising, generating said supply voltage via a switching regulator.

6. The method according to claim 2 comprising, generating said bias voltage via a switching regulator.

7. The method according to claim 2, wherein said bias voltage controls a gain of said amplifier.

8. The method according to claim 1, wherein said amplifier is a linear amplifier.

9. The method according to claim 1, wherein said signal conforms to one or more of a WCDMA protocol, an HSDPA protocol, an HSUDPA protocol, a GSM protocol, a GPRS protocol, an EDGE protocol, a WiMAX protocol, an OFDM protocol, an UWB protocol, a ZigBee protocol, and/or a Bluetooth protocol.

10. A non-transitory computer-readable medium having stored thereon, a computer program having at least one code section for processing signals in a communication system, the at least one code section being executable by a machine for causing the machine to perform steps comprising:
    adjusting a supply voltage and a bias voltage of an amplifier in proportion to an envelope of a baseband signal so that said amplifier amplifies a delayed version of said baseband signal,
    wherein said delayed version of said baseband signal is delayed by a number of samples of said baseband signal, and wherein said delayed version of said baseband signal is based on an amount of intermodulation distortion at an output of said amplifier.

11. The non-transitory computer-readable medium according to claim 10, wherein said at least one code section comprises code that enables adjusting a bias voltage of said amplifier in proportion to said envelope.

12. The non-transitory computer-readable medium according to in claim 10, wherein said at least one code section enables calculating said number of samples by minimizing said amount of said intermodulation distortion at said output of said amplifier.

13. The non-transitory computer-readable medium according to in claim 10, wherein said at least one code section comprises code that enables measuring said envelope by evaluating a plurality of I and Q samples of said signal.

14. The non-transitory computer-readable medium according to in claim 10, wherein said at least one code section comprises code that enables generating said supply voltage via a switching regulator.

15. The non-transitory computer-readable medium according to in claim 11, wherein said at least one code section comprises code that enables generating said bias voltage via a switching regulator.

16. The non-transitory computer-readable medium according to in claim 11, wherein said bias voltage controls a gain of said amplifier.

17. The non-transitory computer-readable medium according to in claim 10, wherein said amplifier is a linear amplifier.

18. The non-transitory computer-readable medium according to in claim 10, wherein said signal conforms to one or more of a WCDMA protocol, an HSDPA protocol, an HSUDPA protocol, a GSM protocol, a GPRS protocol, an EDGE protocol, a WiMAX protocol, an OFDM protocol, an UWB protocol, a ZigBee protocol, and/or a Bluetooth protocol.

19. A system for processing signals in a communication system, the system comprising:
    one or more circuits that enables adjusting a supply voltage and a bias voltage of an amplifier in proportion to an envelope of a baseband signal so that said amplifier amplifies a delayed version of said baseband signal,
    wherein said delayed version of said baseband signal is delayed by a number of samples of said baseband signal, and wherein said delayed version of said baseband signal is based on an amount of intermodulation distortion at an output of said amplifier.

20. The system according to claim 19, wherein said one or more circuits enables adjusting a bias voltage of said amplifier in proportion to said envelope.

21. The system according to claim 19, wherein said one or more circuits enables calculating said number of samples by minimizing said amount of said intermodulation distortion at said output of said amplifier.

22. The system according to claim 19, wherein said one or more circuits enables measuring said envelope by evaluating a plurality of I and Q samples of said signal.

23. The system according to claim 19, wherein said one or more circuits enables generating of said supply voltage via a switching regulator.

24. The system according to claim 20, wherein said one or more circuits enables generating of said bias voltage via a switching regulator.

25. The system according to claim 20, wherein said bias voltage controls a gain of said amplifier.

26. The system according to claim 19, wherein said amplifier is a linear amplifier.

27. The system according to claim 19, wherein said signal conforms to one or more of a WCDMA protocol, an HSDPA protocol, an HSUDPA protocol, a GSM protocol, a GPRS protocol, an EDGE protocol, a WiMAX protocol, an OFDM protocol, an UWB protocol, a ZigBee protocol, and/or a Bluetooth protocol.

* * * * *